United States Patent [19]

Toda

[11] Patent Number: 4,907,165
[45] Date of Patent: Mar. 6, 1990

[54] ELECTRIC ENERGY MEASURING METHOD

[75] Inventor: Masayoshi Toda, Hiroshima, Japan

[73] Assignee: Mitsubishi Denki Kabushiki Kaisha, Tokyo, Japan

[21] Appl. No.: 323,254

[22] Filed: Mar. 13, 1989

Related U.S. Application Data

[63] Continuation of Ser. No. 875,698, Jun. 18, 1986, abandoned.

[30] Foreign Application Priority Data

Jun. 19, 1985 [JP] Japan .................................. 60-132073

[51] Int. Cl.$^4$ ...................... G01R 21/00; G01R 19/00; G06F 15/20
[52] U.S. Cl. .............................. 364/483; 364/571.05; 324/142; 324/130
[58] Field of Search ........... 364/481, 483, 569, 571.02, 364/571.05, 492, 841, 842; 324/142, 130, 76 R

[56] References Cited

U.S. PATENT DOCUMENTS

| | | | |
|---|---|---|---|
| 4,077,061 | 2/1978 | Johnston et al. | 364/483 |
| 4,118,787 | 10/1978 | Arnoux | 364/483 |
| 4,240,149 | 12/1980 | Fletcher et al. | 364/483 |
| 4,250,449 | 2/1981 | Shum | 324/142 |
| 4,282,576 | 8/1981 | Elms et al. | 364/483 |
| 4,459,546 | 7/1984 | Arrington et al. | 364/483 |
| 4,466,074 | 8/1984 | Jindrick et al. | 364/483 |
| 4,535,287 | 8/1985 | Milkovic | 324/142 |
| 4,623,838 | 11/1986 | Nakamura | 364/483 |
| 4,670,713 | 6/1987 | Scheib | 364/483 |
| 4,670,847 | 6/1987 | Furuse | 364/571 |
| 4,672,555 | 6/1987 | Hart et al. | 364/483 |
| 4,752,731 | 6/1988 | Toda | 364/483 |

OTHER PUBLICATIONS

"Transistor Technology", Sep. 1983, pp. 277–278 (partial translation included).

Y. Ikeda et al., "Offset Cancelled Computing Watt-Frequency Converter", JEMIC Technical Report, Oct. 10, 1982, pp. 145–151.

Primary Examiner—Parshotam S. Lall
Assistant Examiner—V. N. Trans
Attorney, Agent, or Firm—Bernard, Rothwell & Brown

[57] ABSTRACT

The method of measuring an electric energy supplied to a load comprises sampling the value of a load voltage or current a desired number of times, converting each of the sampled analog values to a digital value by an A/D converter, accumulating the digital values obtained correspondingly to the number of times of such sampling actions, dividing the accumulated value by the said number to calculate an average value per sampling, and correcting the offset in the A/D converter by the average value thus obtained.

2 Claims, 3 Drawing Sheets

ELECTRIC ENERGY MEASURING METHOD

This is a continuation of application Ser. No. 875,698, filed June 18, 1986, now abandoned.

BACKGROUND OF THE INVENTION

1. Field of the Invention

The present invention relates generally to an electric energy measuring method and, more particularly, to a method of measuring electric energy by the use of a digital multiplication type electronic watt-hour meter.

2. Description of the Prior Art

FIG. 3 is a block diagram of a digital multiplication type electronic watt-hour meter 20 used for the conventional measurement of electric energy.

In FIG. 3, reference numerals 1 and 2 denote input terminals of an electronic watt-hour meter to which a voltage and a current of a circuit to be measured are inputted respectively, wherein the input terminal 1 is connected to one contact 3a of a first changeover switch 3 while the input terminal 2 is connected to another contact 3b thereof. Meanwhile a common contact 3c of the first changeover switch 3 is connected to one contact 4a of a second changeover switch 4 another contact 4b of switch 4 is connected to a reference potential. And a common contact 4c of the second changeover switch 4 is connected to an input of an A/D converter 5, whose output is connected to a bus line 10 which extends to interconnect the A/D converter 5, a central processing unit (hereinafter referred to as CPU) 6, a read-only memory (ROM) 7 for storing instructions and so forth to be executed by the CPU 6 to operate the electronic watt-hour meter 20, a random access memory (RAM) 8 for storing temporary parameter data, and an interface (I/O) 9.

The I/O is connected via an output line 11 to the first changeover switch 3, the second changeover switch 4 and a control input terminal of the A/D converter 5 while being connected via a signal line 12 to an output terminal 13 of the electronic watt-hour meter 20. The RAM 8 incorporates a register to store a momentary power value computed by the CPU 6.

The operation of the digital multiplication type electronic watt-hour meter having the above structure will now be described below with reference to the flow chart of FIG. 4.

The CPU 6 periodically reads out the sequential instructions stored in the ROM 7 and then decodes and executes such instructions. First, a changeover command signal is outputted via the output line 11 so as to connect the common contact 4c of the second changeover switch 4 to the contact 4b, thereby introducing the reference potential to the A/D converter 5 (step 211). An output digital value of the A/D converter 5 corresponding to the aforesaid potential, i.e. a digital value corresponding to the offset in the A/D converter 5, is fed to the RAM 8 via the bus line 10 and is stored therein (step 213). Upon storage of the digital value in the RAM 8 in step 213, changeover command signals are outputted via the I/O 9 and the output line 11 so as to connect the second changeover switch 4 to the contact 4a and also to connect the common contact 3c of the first changeover switch 3 to the contact 3a respectively, whereby a load voltage applied to the input terminal 1 is introduced to the A/D converter 5 (step 215). The load voltage thus inputted to the A/D converter 5 in step 215 is converted to a digital value corresponding to the load voltage (step 217). Since this digital value includes the offset generated in the A/D converter 5 and so forth, the harmful influence of such offset is removed by subtracting therefrom the aforesaid digital value corresponding to the offset of the A/D converter 5 and stored in step 213, thereby obtaining a digital value corresponding to the input voltage (step 219).

After the offset-removed input voltage is thus calculated in step 219, a changeover command signal is outputted via the I/O 9 and the output line 11 so as to change the connection of the first changeover switch 3 from the contact 3a to the contact 3b, whereby the load current fed to the input terminal 2 is introduced to the A/D converter (step 221). The load current inputted to the A/D converter 5 in step 221 is converted to a digital value corresponding to the load current (step 223). Since this digital value includes the offset generated in the A/D converter 5 and so forth, the aforesaid digital value corresponding to such offset of the A/D converter 5 and stored in step 213 is subtracted to obtain a digital value corresponding to the input current where the harmful influence of the offset has been removed (step 225). After calculation of the digital value corresponding to the offset-free input current in step 225, this digital value is multiplied (step 227) by the digital value obtained previously in step 219, and the result is inputted as a momentary power value of the measured circuit to the register incorporated in the RAM 8 and then is accumulated in the register (step 229). Thereafter the process from step 211 through step 229 is repeated periodically so that the momentary power values free from the offset are inputted to and accumulated in the register, and upon attainment of the accumulation to a predetermined value (step 231), the aforesaid data is fed to the output terminal 13 via the I/O 9 and the signal line 12 (step 233) while the register is cleared (step 235).

In the known electric energy measurement performed by the above-described conventional digital multiplication type electronic watt-hour meter 20, it is desired that the period of serial operations from A/D conversion to multiplication and accumulation be as short as possible in view of enhancing the characteristics relative to distortion in the input waveform. In an exemplary case of repeating 200 times the process from step 211 through step 229 at a frequency of 50 Hz, the period needs to be 100 μsec.

However, for repeating 200 times the steps 211 through 229 within a period of 100 μsec, the CPU 6 and other components employed should be capable of performing sufficiently fast operations. Consequently, a problem has been existent heretofore that high-precision measurement is impossible by the use of an inexpensive low-loss digital multiplication type electronic watt-hour meter.

The present invention has been accomplished in an attempt to eliminate the problem mentioned above.

SUMMARY OF THE INVENTION

In an exemplary mode of the present invention, a method of measuring an electric energy supplied to a load comprises: sampling an analog value representative of the load voltage and/or current, and repeating such sampling actions a preset number of times; converting each of the sampled analog values to a digital value, and accumulating the digital values until the sampling actions are repeated the preset number of times; upon attainment of such repeated sampling actions to the said preset number, dividing the accumulated value by the said number to calculate an average digital value per sampling; and correcting the sampled value at the next sampling time by using the average digital value thus obtained as an offset correction value.

The method of this invention can be carried out by sampling either the current or the voltage of a load and is capable of providing a satisfactory result of measurement with a considerably high precision. However, the most desirable result is achieved by sampling both the current and the voltage.

According to this method, the offset generated in the A/D converter can be corrected by the average value of the sampled current or voltage within a predetermined time, hence realizing elimination of the known procedure for measuring the offset in the A/D converter to eventually ensure fast measurement.

DESCRIPTION OF THE PREFERRED EMBODIMENTS

Figure 1:
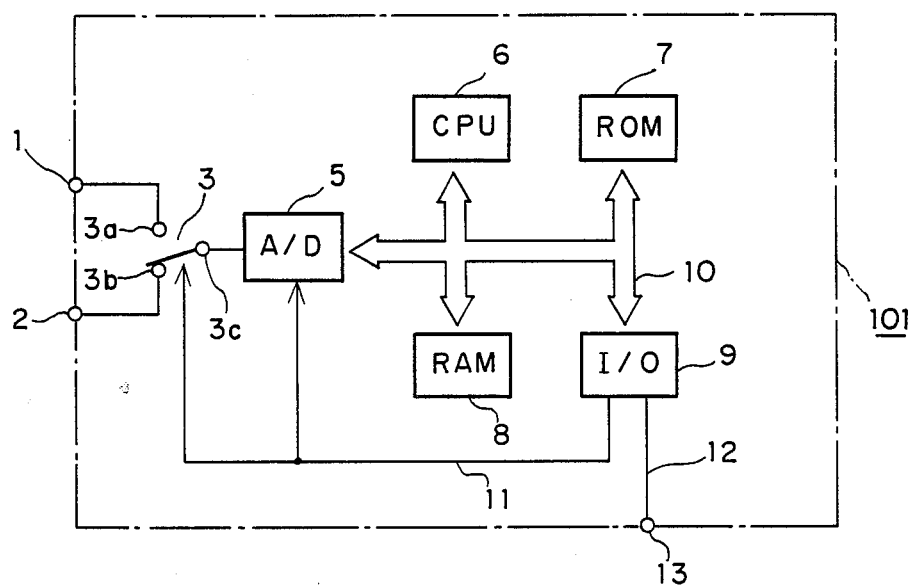
FIG. 1 is a block diagram of a digital multiplication type electronic watt-hour meter adapted to carry out the method of this invention.
Figure 3:
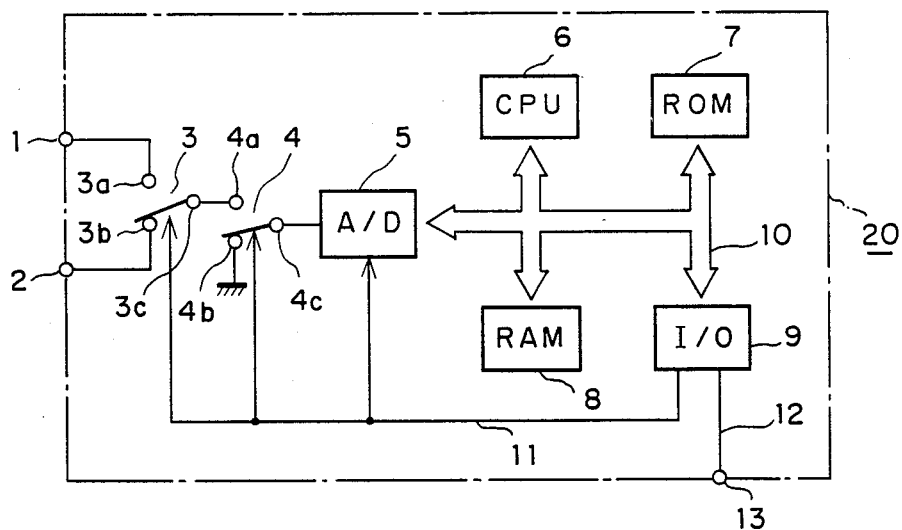
FIG. 3 is a block diagram of a conventional watt-hour meter.

FIG. 1 shows a digital multiplication type electronic watt-hour meter designed to measure electric energy according to the method of the present invention. Similarly to the aforementioned conventional example of FIG. 3, this watt-hour meter 101 has input terminals 1 and 2, a changeover switch 3, an A/D converter 5, a CPU 6, a ROM 7, a RAM 8, an I/O 9, a bus line 10, signal lines 11 and 12, and an output terminal 13. Such components are substantially identical with those designated by the same reference numerals in FIG. 3. The watt-hour meter of FIG. 1 differs from the aforesaid meter of FIG. 3 in the points that five registers are incorporated in the RAM 8 and the second changeover switch is omitted.

Figure 2:
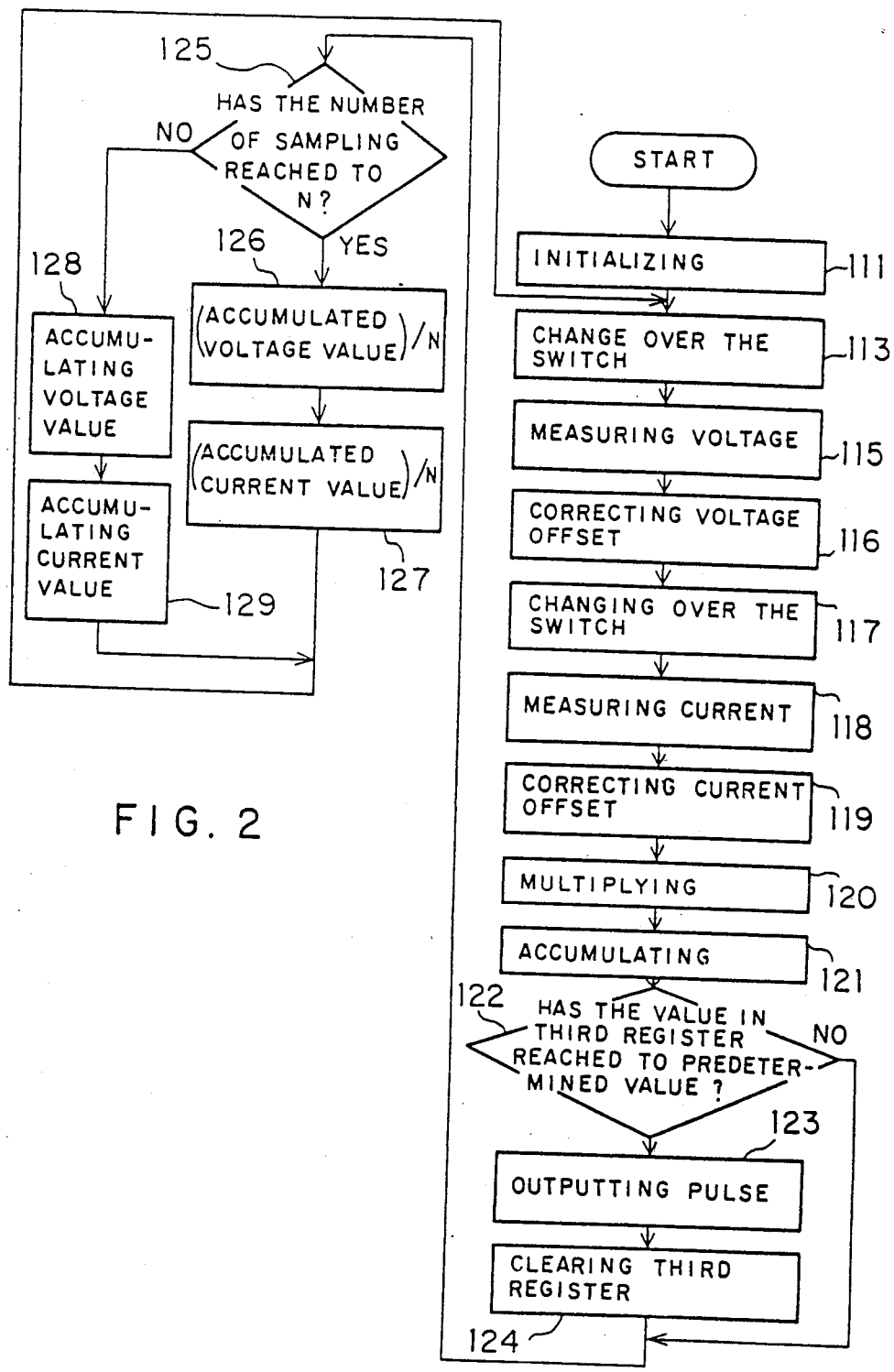
FIG. 2 is a flow chart of the operation performed in the watt-hour meter of FIG. 1.
Figure 4:
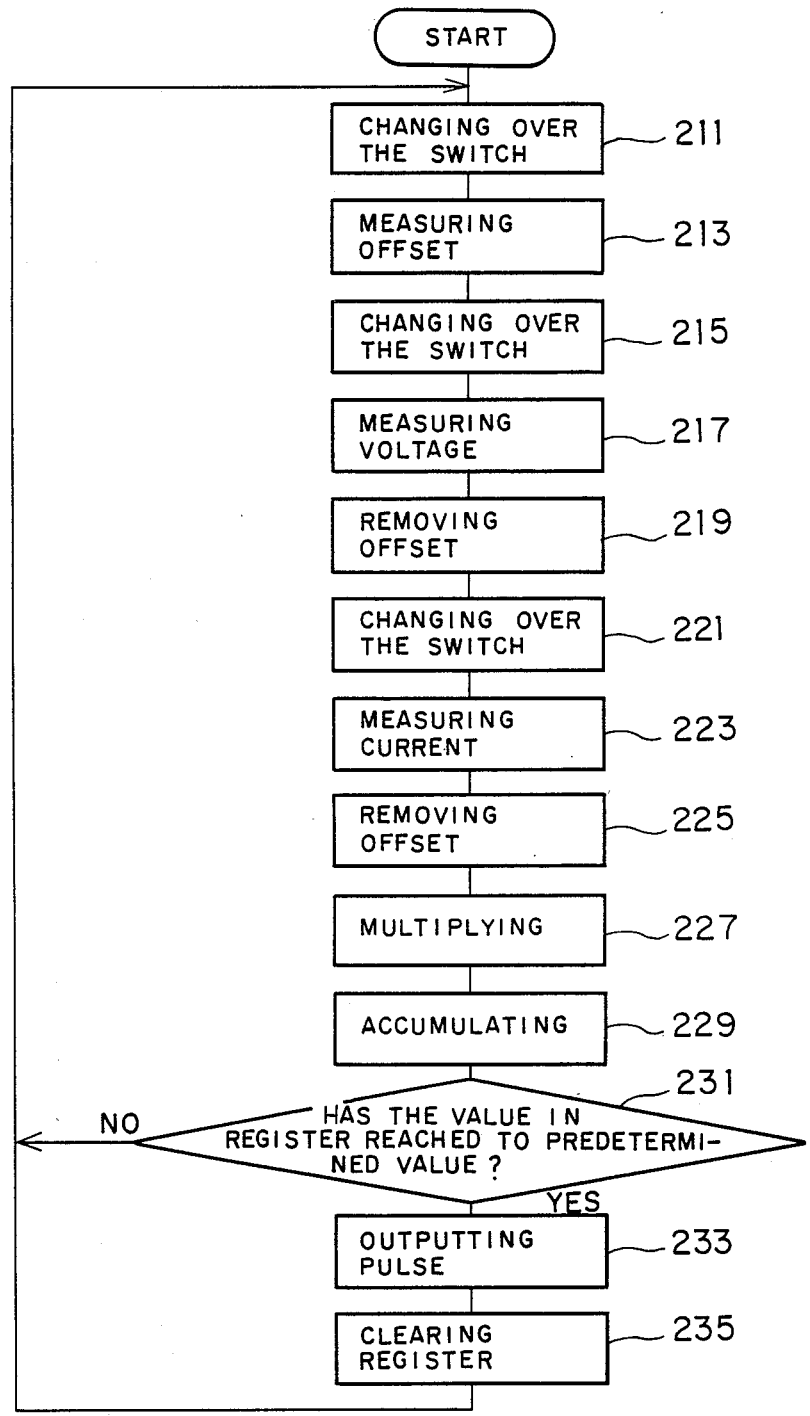
FIG. 4 is a flow chart of the operation performed in the watt-hour meter of FIG. 3.

Hereinafter the measuring method of this invention in the watt-hour meter of FIG. 1 will be described with reference to the flow chart of FIG. 2.

Prior to starting detection, the CPU 6 presets a number N of sampling actions to be repeated for obtaining an average of sampled detection values from an accumulation thereof, and clears the first and second registers which store a digital value representing the above average to be used as an offset correction value for subsequent correction of the offset (step 111).

After presetting the number N of sampling actions in step 111, the CPU 6 produces a changeover command signal via the output line 11 so as to change the connection of the changeover switch 3 from contact 3b to contact 3a, and then a load voltage not including any DC component and applied to the input terminal 1 is introduced to the A/D converter 5 (step 113). The load voltage thus inputted to the A/D converter 5 in step 113 is converted to a digital value corresponding to the load voltage (step 115). This digital value is corrected, with respect to the offset, by the value in the first register of the RAM 8 cleared initially in step 111, thereby providing a digital value which corresponds to the offset-removed load voltage (step 116).

Subsequently, connection of the changeover switch 3 is changed via the I/O 9 to the contact 3b so that the load current is introduced to the A/D converter 5 (step 117). The load current thus inputted to the A/D converter 5 in step 117 is converted to a digital value corresponding to the load current (step 118). This digital value is corrected, with respect to the offset, by the value in the second register of the RAM 8 cleared initially in step 111, thereby providing a digital value which corresponds to the offset-removed load current (step 119).

The digital values obtained in steps 116 and 119 corresponding to the offset-free load voltage and current are multiplied in the CPU 6 (step 120), and the result of such multiplication is accumulated in the third register of the RAM 8 (step 121). And in case the accumulation has attained to a predetermined value (step 122), a pulse output is produced via the I/O 9 to the output terminal 13 (step 123). Subsequently the content of the third register is cleared merely by a numerical value corresponding to the output of one pulse (step 124). Meanwhile, in case the content of the third register is found to be below the predetermined value in step 122 or upon completion of step 124, a test is conducted (step 125) to ascertain whether the serial sampling operations from step 113 through step 124 have attained to the initially preset number N and, if not, the digital values obtained in steps 115 and 119 are accumulated in the fourth and fifth registers of the RAM 8 (steps 128 and 129), and then the aforesaid serial operations from step 113 are performed again. When the number N of sampling actions has reached the preset value, the contents of the fourth and fifth registers are divided by N in steps 126 and 127 to provide new offset correction values which are then transferred to the first and second registers of the RAM 8, and subsequently the process proceeds to step 113 to continue the serial operations.

Although a changeover switch 3 is employed in the above embodiment, the same effect is also achievable by the use of two A/D converters 5 with elimination of the switch 3. Furthermore, the microprocessor configuration of CPU 6, ROM 7 and RAM 8 described as an example to perform the serial operations may be replaced with a wired logic circuit to execute the same operations without any impediment.

Besides the aforementioned correction carried out by calculating offset values of both voltage and current, similar effect is also attainable by correcting the offset of merely the voltage or current alone, since harmful influence of the offset thereof can be averaged and eliminated in the process of accumulating momentary electric energy.

According to the present invention, as described hereinabove, the procedure for measuring the offset in the A/D converter and so forth can be omitted and a digital value corresponding to such offset is obtainable merely by accumulating a series of A/D converted values, so that it is rendered possible to perform high-precision measurement by the use of an inexpensive low-loss digital multiplication type electronic watt-hour meter which is capable of executing successive operations of A/D conversion, multiplication and accumulation at high speeds without the necessity of employing any fast-acting component.

What is claimed is:

1. A method of measuring an electric energy supplied to a load, comprising:
   sampling an analog value representative of the voltage and/or current of said load, and repeating such sampling actions a preset number of times;
   converting each of the sampled analog values to a digital value, and accumulating the digital values until the sampling actions are repeated the preset number of times;
   upon attainment of the sampling actions to said present number, dividing the accumulated digital value by said number to calculate an average digital value per sampling and thereby determining the offset value included in said digital values while said values are in the digital format;
   correcting the sampled digital value at the next sampling time by subtracting said average digital value from said next sampled digital value as an offset correction value; and
   measuring the electric energy supplied to said load by using corrected sample digital values.

2. The method as defined in claim 1, wherein an analog value representing the load voltage and an analog value representing the load current are selected alternately upon completion of each of sampling actions repeated a predetermined number of times.

* * * * *